United States Patent
Jang

(10) Patent No.: US 8,835,969 B2
(45) Date of Patent: Sep. 16, 2014

(54) LIGHT EMITTING DEVICE PACKAGE AND LIGHTING SYSTEM

(71) Applicant: LG Innotek Co., Ltd, Seoul (KR)

(72) Inventor: Ji Won Jang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/013,882

(22) Filed: Aug. 29, 2013

(65) Prior Publication Data

US 2014/0008687 A1    Jan. 9, 2014

Related U.S. Application Data

(63) Continuation of application No. 12/947,282, filed on Nov. 16, 2010, now Pat. No. 8,530,918.

(30) Foreign Application Priority Data

Nov. 17, 2009   (KR) .................. 10-2009-0111034

(51) Int. Cl.
   *H01L 33/58*   (2010.01)
(52) U.S. Cl.
   USPC ............... 257/98; 257/79; 257/99; 257/100; 257/103; 257/E33.056
(58) Field of Classification Search
   USPC .................... 257/13, 79–103, 918, 257/E51.018–E51.022, E33.001–E33.077, 257/E33.054, E25.028, E25.032
   See application file for complete search history.

(56) References Cited

U.S. PATENT DOCUMENTS

| | | | |
|---|---|---|---|
| 5,907,151 A | 5/1999 | Gramann et al. |
| 6,747,293 B2 | 6/2004 | Nitta et al. |
| 7,161,190 B2 | 1/2007 | Chikugawa |
| 8,049,230 B2 | 11/2011 | Chan et al. |
| 2004/0217369 A1 | 11/2004 | Nitta et al. |
| 2006/0027829 A1 | 2/2006 | Wang et al. |
| 2007/0212802 A1 | 9/2007 | Lee et al. |
| 2008/0023714 A1 | 1/2008 | Chae et al. |
| 2008/0121922 A1 | 5/2008 | Chen |
| 2008/0303052 A1 | 12/2008 | Lee et al. |
| 2009/0067175 A1 | 3/2009 | Chen et al. |
| 2009/0278153 A1 | 11/2009 | Cho |
| 2009/0290273 A1 | 11/2009 | Shih et al. |
| 2010/0301373 A1 | 12/2010 | Urano et al. |
| 2011/0175132 A1 | 7/2011 | Kwon |
| 2011/0204408 A1 | 8/2011 | McKenzie et al. |
| 2012/0199843 A1 | 8/2012 | Heikman et al. |

FOREIGN PATENT DOCUMENTS

| | | |
|---|---|---|
| CN | 1381906 A | 11/2002 |
| CN | 2717026 | 8/2005 |

(Continued)

OTHER PUBLICATIONS

European Search Report dated Mar. 7, 2011 issued in Application No. 10 19 1573.

(Continued)

*Primary Examiner* — Mamadou Diallo
(74) *Attorney, Agent, or Firm* — KED & Associates LLP

(57) ABSTRACT

Disclosed are a light emitting device package and a lighting system. The light emitting device package includes a body including a cavity and formed in a transmittive material; a plurality of lead electrodes in the cavity; an isolation member disposed between the lead electrodes; a light emitting device electrically connected to the lead electrodes in the cavity; and a molding member on the light emitting device.

20 Claims, 8 Drawing Sheets

(56) References Cited

FOREIGN PATENT DOCUMENTS

| | | |
|---|---|---|
| EP | 0 854 523 | 7/1998 |
| JP | 59-151477 A | 8/1984 |
| JP | 2005-243795 | 9/2005 |
| JP | 2006-303397 | 11/2006 |
| JP | 2007-49152 | 2/2007 |
| JP | 2007-318176 | 12/2007 |
| JP | 2009-111140 | 5/2009 |
| KR | 10-2004-0044701 | 5/2004 |
| KR | 10-2005-0082711 | 8/2005 |
| KR | 10-2008-0041818 A | 5/2008 |
| KR | 10-2009-0026671 | 3/2009 |
| KR | 10-2009-0032775 A | 4/2009 |
| KR | 10-2009-0116351 A | 11/2009 |

OTHER PUBLICATIONS

Korean Office Action dated Apr. 6, 2011 issued in Application No. 10-2009-0111034.

U.S. Office Action dated Dec. 31, 2012 for U.S. Appl. No. 12/947,282.

Japanese Office Action for Application 2010-256647 dated Mar. 27, 2014.

Chinese Office Action dated Apr. 2, 2014 for Application 201010551198.4.

LIGHT EMITTING DEVICE PACKAGE AND LIGHTING SYSTEM

This application is a Continuation of co-pending U.S. patent application Ser. No. 12/947, 282 filed on Nov. 16, 2010, which claims priority under 35 U.S.C. §119 of Korean Patent Application No. 10-2009-0111034 filed on Nov. 17, 2009, which is hereby incorporated by reference in its entirety.

BACKGROUND

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include semiconductor materials having the compound formula of $In_xAl_yGa_{1-x-y}N$ ($0 \le x \le 1$, $0 \le y \le 1$, and $0 \le x+y \le 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

SUMMARY

The embodiment provides a light emitting device package having a novel structure.

The embodiment provides a light emitting device package having a wide beam angle.

The embodiment provides a light emitting device package having a transmittive body.

The embodiment can improve the reliability of a light emitting package and a lighting system having the same.

An embodiment provides a light emitting device package comprising: a body including a cavity and fondled in a transmittive material; a plurality of lead electrodes in the cavity; a division part disposed between the lead electrodes; a light emitting device electrically connected to the lead electrodes in the cavity; and a molding member on the light emitting device.

An embodiment provides a light emitting device package comprising: a body including a cavity and formed in a transmittive material; a plurality of lead electrodes disposed in the cavity and extending toward a bottom surface of the cavity; a isolation member disposed between lead electrodes and including a non-transmittive material; a light emitting device mounted on at least one of the lead electrodes in the cavity; and a molding member on the light emitting device mounted in the cavity.

DETAILED DESCRIPTION OF THE EMBODIMENTS

Figure 1:
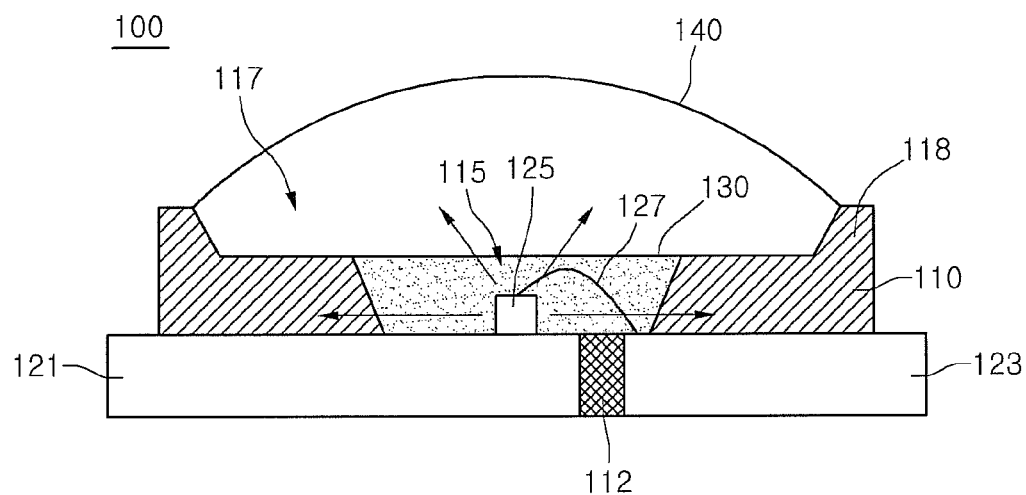
FIG. 1 is a side sectional view showing a light emitting device package according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device package according to the first embodiment.

Referring to FIG. 1, the light emitting device package 100 includes a cavity 115, a receiving part 117, a first lead electrode 121, a second lead electrode 123, a body 110, an isolation member 112, a light emitting device 125, a molding member 130 and a lens member 140.

The body 110 includes a transmittive material, such as a resin material including silicon or epoxy, or a glass material. The body 110 may have a cylindrical shape or a polygonal shape. The outer appearance of the body 110 may be changed depending on the injection molding process and/or the etching process for body 110. According to the embodiment, the body 110 has a substantially rectangular shape having the cavity 115 with an open top surface.

The body 110 may include an insulating material having the light transmittance of about 80% or more.

The first and second lead electrodes 121 and 123 are disposed in the cavity 115 of the body 110 while being electrically insulated from each other.

A first section of the first lead electrode 121 extends to the bottom surface of the cavity 115 by passing through a first region of the body 110, and a first section of the second lead electrode 123 extends to the bottom surface of the cavity 115 by passing through a second region of the body 110. The first region may be located in opposition to the second region in the cavity 115, but the embodiment is not limited thereto.

Second sections of the first and second lead electrodes 121 and 123 may extend out of the body 110. According to the embodiment, at least one second section of the first and second lead electrodes 121 and 123 may branch out of the body 110. For instance, second sections of the first and second lead electrodes 121 and 123 may branch out of the body 110 while being electrically connected to each other.

The first sections of the first and second lead electrodes 121 and 123 are disposed in the body 110, and the second sections of the first and second lead electrodes 121 and 123 are disposed out of the body 110.

The first and second lead electrodes 121 and 123 can be formed by selectively using a lead frame, a metal plating layer and a through-hole structure. For the purpose of convenience of explanation, the first and second lead electrodes 121 and 123 formed by using the lead frame will be described below. The first sections of the first and second lead electrodes 121 and 123 may pass through the body 110 and the other ends of the first sections of the first and second lead electrodes 121 and 123 may be subject to the trimming process and/or forming process. The trimming and forming processes may be changeable.

At least one part of the first and second lead electrodes 121 and 123 may be exposed to the lower surface of the body 110 or may be disposed on the same plane with the lower surface of the body 110.

One ends of the first and second lead electrodes 121 and 123 may be disposed in the cavity 115 of the body 110, and an inner wall of the cavity 115 may be perpendicular or inclined to the bottom surface of the cavity 115. The light emitting device 125 can be disposed in the cavity 115. The light emitting device 125 can be mounted on at least one lead electrode 121 or 123 and electrically connected to the first and second leas electrodes 121 and 123.

The first and second lead electrodes 121 and 123 may be separated from each other by the isolation member 112. The isolation member 112 may include a material different from a material of the body 110. For instance, the isolation member 112 may include a material having light transmittance lower or higher than that of the material of the body 110. In detail, the isolation member 112 may include a material having the light transmittance of about 50% or above. The isolation member 112 may includes an insulating material.

For example, the isolation member 112 may include polymer-based resin, such as PPA (polyphthal amide), LCP (liquid crystal polymer), PPS (polyphenylene sulfide) or PEEK (polyether ether ketone).

The isolation member 112 is disposed between the first and second lead electrodes 121 and 123 while insulating the first and second lead electrodes 121 and 123 from each other.

At least one part of the isolation member 112 can extend or can be inserted into the first lead electrode 121 and/or the second lead electrode 123 to support the first and second lead electrodes 121 and 123.

An area of a top surface of the first and second lead electrodes 121 and 123 is about 80% or above with respect to an area of a lower surface of the body 110. In this case, light reflection can be improved by the first and second lead electrodes 121 and 123 disposed in the body 110.

The top surfaces of the first and second lead electrodes 121 and 123 may have light reflectance of about 50% or above.

A width of the first lead electrode 121, the second lead electrode 123 and the isolation member 122 is larger than a width of the body 110 to prevent light from being leaked downward from the body 110. Thus, the light loss can be reduced.

The first and second lead electrodes 121 and 123 supply power to the light emitting device 125. The first and second lead electrodes 121 and 123 dissipate heat generated from the light emitting device 125 and reflect the light emitted from the light emitting device 125.

At least one light emitting device 125 is disposed in the cavity 115. If plurality of LED chips are mounted, the pattern of the first and second lead electrodes 121 and 123 may be changed.

The light emitting device 125 can be connected to the first and second lead electrodes 121 and 123 through a wire bonding scheme using at least one wire 127 or through a die bonding scheme.

The light emitting device 125 may include a visible-band LED chip, such as a blue LED chip, a green LED chip, and a red LED chip, or a UV LED chip. According to the embodiment, the light emitting device 125 includes the blue LED chip.

The receiving part 117 is formed on the body 110. The cavity 115 is disposed under the center of the receiving part 117 formed on the body 110. That is, the receiving part 117 is located above the cavity 115. A width of the receiving part 117 may be wider than a width of the upper portion of the cavity 115.

The receiving part 117 may be defined by a protrusion 118 protruding from an outer portion of the body 110. The protrusion 118 protrudes from the outer peripheral portion of the body 110 beyond the top surface of the body 110 to form the receiving part 117.

The space formed in the cavity 115 and/or the receiving part 117 is defined by the body 110 and/or at least one lead electrode 121 or 123. Such a space may be variously modified within the technical scope of the embodiment.

The molding member 130 is formed in the cavity 115. The molding member 130 may include a transmittive resin material such as silicon or epoxy. At least one type of phosphor and/or diffusing agents can be added to the molding member 130, but the embodiment is not limited thereto. The phosphor may include a yellow luminescence material, a green luminescence material, a red luminescence material or a blue luminescence material. The type of the LED chips and the phosphor formed in the cavity 115 may be changed according to the target light of the package, and the embodiment is not limited thereto.

The molding member 130 may have a flat top surface. According to another embodiment, the molding member 130 may have a concave top surface or a convex top surface. A concavo-convex light extraction pattern can be formed on the top surface of the molding member 130.

When viewed from the top, the cavity 115 of the body 110 may have a circular shape or a polygonal shape. A part of the light emitted from the light emitting device 125 can be reflected from the inner wall of the cavity 115 or may transmit through the inner wall of the cavity 115. When viewed from the top, the receiving part 117 of the body 110 may have a circular shape or a polygonal shape, which can be changed depending on the external appearance of the body 110.

The lens member 140 may have a convex lens shape or a hemispherical lens shape. At least a part of the lens member 140 may have a flat shape.

The lens member 140 is disposed on the receiving part 117 and makes contact with an inner surface of the protrusion 118.

Since the lens member 140 makes contact with the inner surface of the receiving part 117 while being supported by the protrusion 118, the lens member 140 can be prevented from being separated from the body 110. In addition, the protrusion 118 of the body 110 may be exposed out of the lens member 140.

The lens member 140 is formed on the molding member 130 and the body 110 such that the light generated from the light emitting device 125 can be emitted to the outside. The lens member 140 may adjust the beam angle of the light.

The lens member 140 can be formed on the receiving part 117 by selectively using a resin material, such as silicon or epoxy, a polymer resin material, and a glass material. In addition, at least a part of the lens member 140 may include a luminescence material or a color conversion material.

The lens member 140 can be molded on the receiving part 117 by using a resin material or can be attached to the receiving part 117 by separately manufacturing the lens member 140. One of the cavity 115 and the receiving part 117 may be omitted and the position of the light emitting device 125 can be changed.

The lens member 140 may be spaced apart from the light emitting device 125 and a part of the lens member 140 can be disposed in the cavity 115, but the embodiment is not limited thereto.

In addition, another transmittive resin layer or another transmittive phosphor layer can be disposed between the molding member 130 and the lens member 140, but the embodiment is not limited thereto.

The light generated from the light emitting device 125 disposed in the cavity 115 can be omni-directionally emitted. Most of the light transferring toward the lens member 140 through the top surface of the molding member 130 may be emitted in the upward direction, and the light transferring toward the body 110 may be emitted in the lateral direction through the body 110.

In addition, the light reflected from the first and second lead electrodes 121 and 123 is transferred toward the lens 140 through the body 110.

Therefore, the light emitting device package 100 may have the light distribution over the extension line of the first and second lead electrodes 121 and 123 and the beam angle of the light is in the range of 160° to 180°.

Accordingly, the light emitting device package 100 can widen the beam angle of the light due to the transmittive body 110 and can improve the color variation in the light distribution region.

Figure 2:
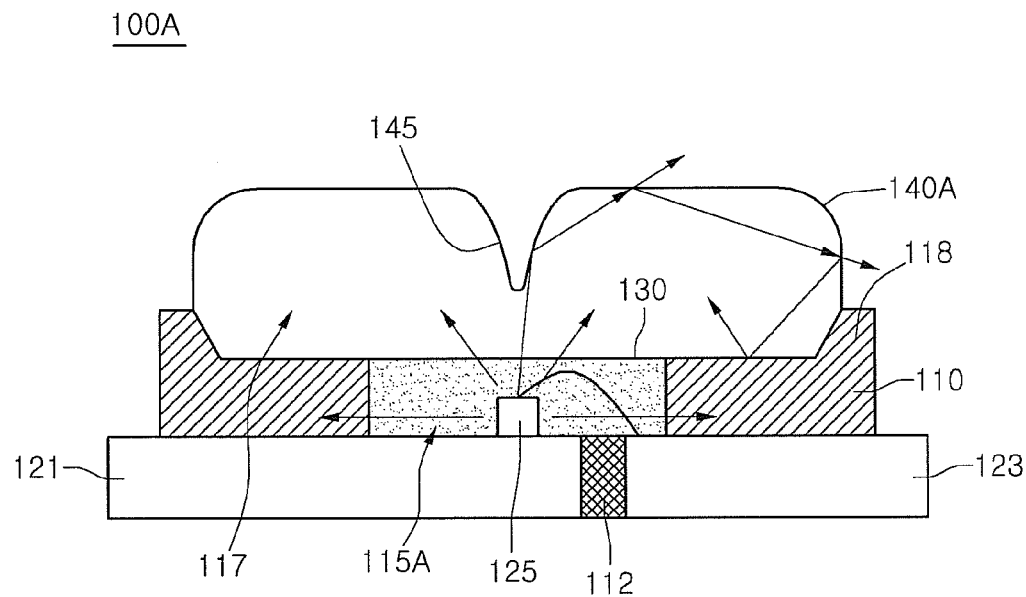
FIG. 2 is a side sectional view showing a light emitting device package according to the second embodiment.

FIG. 2 is a side sectional view showing a light emitting device package according to the second embodiment. In the second embodiment, the same reference numerals will be assigned to the same elements and description about the elements and structures that have already been explained in the first embodiment will be omitted in order to avoid redundancy.

Referring to FIG. 2, the light emitting device package 100A includes a lens member 140A disposed on the transmittive body 110. The lens member 140A has a reflective type lens structure. According to the reflective type lens structure, the quantity of light extracted through the lateral side of the lens member 140A is greater than the quantity of light extracted through the center of the lens member 140A.

A recess 145 is formed at a predetermined portion of the lens member 140A. For instance, the recess 145 is formed at the center of the lens member 140A. The recess 145 is closer to the light emitting device 123 as compared with the outer peripheral region of the lens member 140A. The recess 145 may have a conical shape. Since the recess 145 is formed at the center of the lens member 140A, which overlaps with the light emitting device 125 in the longitudinal direction, the recess 145 can reflect the incident light in the lateral direction.

The top surface of the lens member 140A is disposed around the recess 145 and has a flat shape or a convex shape, but the embodiment is not limited thereto. The lens member 140A may have a hemispherical external shape, but the embodiment is not limited thereto.

The recess 145 of the lens member 140A is located above the light emitting device 125. When viewed from the top, the recess 145 may have a circular shape or a polygonal shape. In addition, a width of the recess 145 may be gradually reduced toward the light emitting device 125.

The recess 145 is spaced apart from the molding member 130 and reflects the diffused light from among the lights emitted from the light emitting device 125.

An inner wall of a cavity 115A is perpendicular to the bottom surface of the cavity 115A in such a manner that the light emitted from the light emitting device 125 can be incident into the body 110. Since the cavity 115A has the inner wall perpendicular to the bottom surface of the cavity 115A, the light transmittance can be increased.

The light emitting device package 100A may increase the amount of the light transferring in the lateral direction, so the light emitting device package 100A can widen the beam angle of the light and can improve the color variation in the light distribution region.

Figure 3:
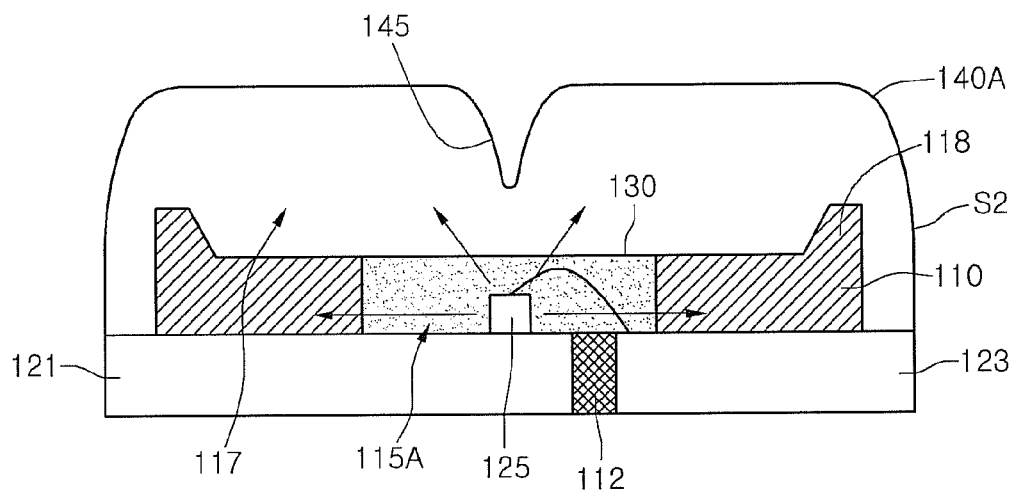
FIG. 3 is a side sectional view showing a light emitting device package according to the third embodiment.

FIG. 3 is a side sectional view showing a light emitting device package according to the third embodiment.

Referring to FIG. 3, the light emitting device package 100A has the lens member 140A modified from the lens member 140A shown in FIG. 2. In detail, an outer portion S2 of the lens member 140A extends while surrounding the lateral side of the body 110 and a lower surface of the outer portion S2 of the lens member 140A makes contact with the top surface of the lead electrodes 121 and 123.

The lens member 140A may include a transmittive resin material. Since the lens member 140A surrounds the body 110, moisture can be prevented from penetrating into the body 110. The light emitting device package 100A can improve the beam angle of the light due to the transmittive body 110 and the lens member 140A. The lens member 140 can reflect the light emitted in the lateral direction of the body 110.

Figure 4:
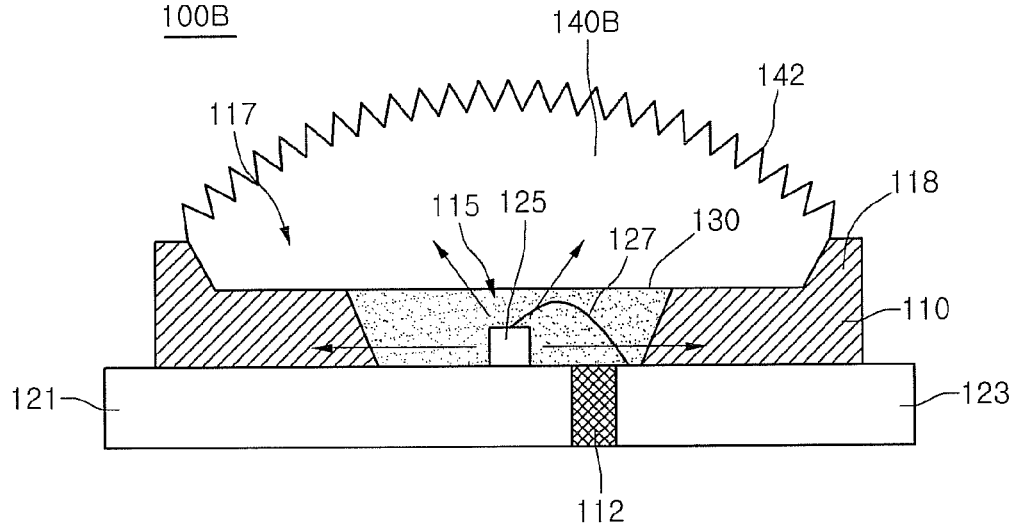
FIG. 4 is a side sectional view showing a light emitting device package according to the fourth embodiment.

FIG. 4 is a side sectional view showing a light emitting device package according to the fourth embodiment. In the fourth embodiment, the same reference numerals will be assigned to the same elements and description about the elements and structures that have already been explained in the first embodiment will be omitted in order to avoid redundancy.

Referring to FIG. 4, the light emitting device package 100B includes a lens member 140B formed on a top surface thereof with a first pattern 142. In detail, a plurality of first patterns 142 are formed on the top surface of the lens member 140B, in which the first patterns 142 are concentrically aligned and the center thereof corresponds to the center of the lens member 140B.

The first patterns 142 can be formed over the entire surface of the lens member 140B. According to the another embodiment, the first patterns 142 can be formed on the center of the top surface of the lens member 140B, on the peripheral portion of the top surface of the lens member 140B, or between the center and the top surface of the lens member 140B.

The first patterns 142 may have at least one of circular shapes with different diameters about the center of the first patterns 142, oval shapes, aspherical shapes, and polygonal shapes. The first patterns 142 are aligned along the top surface of the lens member 140B. Each first lens pattern 142 may have a conical shape having a symmetrical or asymmetrical structure, or a prism shape.

The size of the first patterns 142 may be gradually reduced from the center to the outer portion of the top surface of the lens member 140B. In addition, the height of the first patterns 142 may be gradually lowered from the center to the outer portion of the top surface of the lens member 140B. The height of the first patterns 142 may correspond to a gap between the top surface of the body 110 and the top surface of the lens member 140B.

The first patterns 142 may be regularly, irregularly or randomly arranged. An interval among the first patterns 142 may be an interval among vertexes or roots of the first patterns 142.

The first patterns 142 of the lens member 140B may refract or diffuse the light when the light emitted from the light emitting device 125 is reflected from or transmitted through the first patterns 142. The light extracted through the lens member 140B may have uniform light distribution at the center and the side of the lens member 140B. In addition, the color variation rarely occurs between the center and the side of the lens member 140B. The color variation may be further improved by the first patterns 142 which are concentrically arranged.

Figure 5:
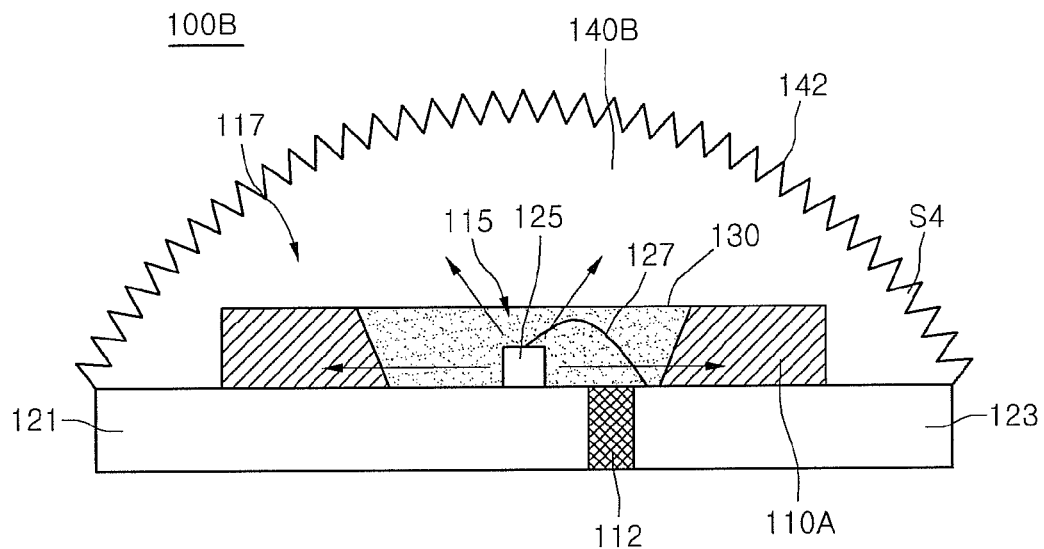
FIG. 5 is a side sectional view showing a light emitting device package according to the fifth embodiment.

FIG. 5 is a side sectional view showing a light emitting device package according to the fifth embodiment.

Referring to FIG. 5, the light emitting device package 100B includes a transmittive body 110A having a cavity 115 and a lens member 140B surrounding the body 110A. An outer portion S4 of the lens member 140B is spaced outward from the lateral side of the body 110A, and a lower surface of the outer portion S4 makes contact with the top surface of the lead electrodes 121 and 123.

First patterns 142 having the concavo-convex structure are formed on the entire top surface of the lens member 140B. The first patterns 142 are concentrically arranged about the center of the lens member 140B.

The lens member 140B may refract or reflect the light when the light emitted from the light emitting device 125 is transmitted through the molding member 130 and the body 110A, so that the light extracted through the lens member 140B may have uniform light distribution at the center and the side of the lens member 140B. In addition, the color variation rarely occurs between the center and the side of the lens member 140B. The color variation may be further improved by the first patterns 142 which are concentrically arranged.

Figure 6:
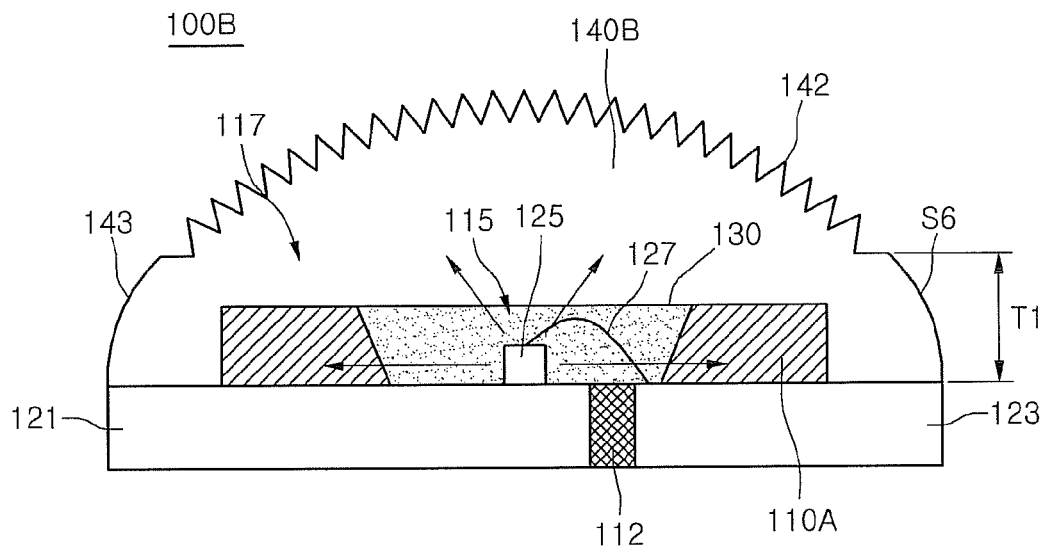
FIG. 6 is a side sectional view showing a light emitting device package according to the sixth embodiment.

FIG. 6 is a side sectional view showing a light emitting device package according to the sixth embodiment.

Referring to FIG. 6, the light emitting device package 100B includes a transmittive body 110A having a cavity 115 and a lens member 140B surrounding the body 110A. An outer portion S6 of the lens member 140B is spaced outward from the lateral side of the body 110A, and a lower surface of the outer portion S6 makes contact with the top surface of the lead electrodes 121 and 123.

The lens member 140B includes first patterns 142. The first patterns 142 are disposed in a first region of the lens member 140B and have the concavo-convex configuration concentrically arranged about the center of the lens member 140B. The first region corresponds to an opening region of the cavity 115 or the top surface of the body 110A.

A second region of the lens member 140B is the outer portion S6 of the lens member 140B except for the first region and corresponds to the lateral side of the body 110. A height T1 of the outer portion S6 of the lens member 140B is longer than a height of the lateral side of the body 110A.

The outer portion S6 of the lens member 140B is curved or perpendicular to the top surface of the lead electrodes 121 and 123. The lens member 140B is divided into the first region having the first patterns 142 and the second region having no first patterns 142, so that the light distribution can be improved at the side of the lens member 140B, rather than the center of the lens member 140B.

The lens member 140B may refract or reflect the light transmitted through the molding member 130 and the body 110A, so that the light extracted through the lens member 140B may have uniform color variation due to the first patterns 142. In addition, the beam angle of the light can be improved due to the second region having the first patterns 142.

Figure 7:
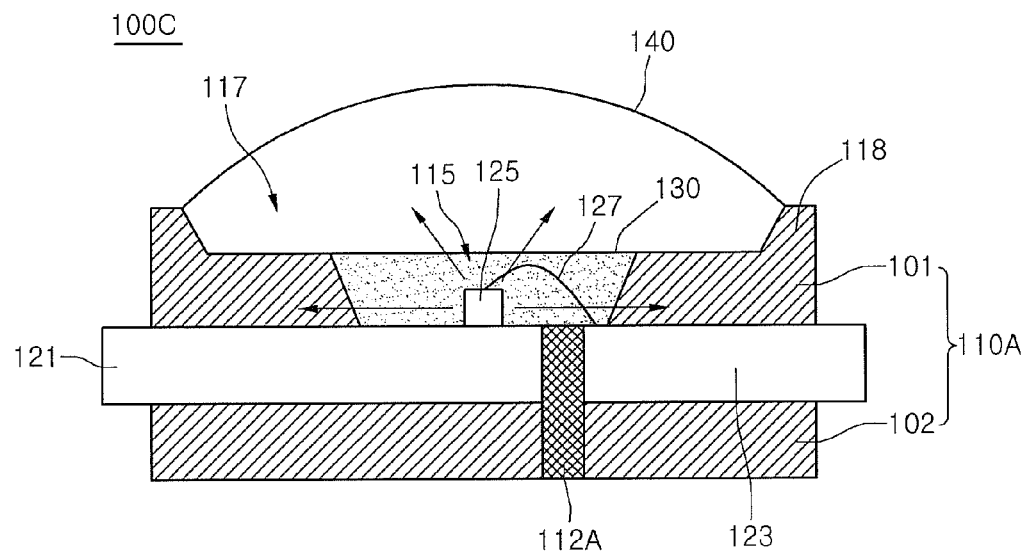
FIG. 7 is a side sectional view showing a light emitting device package according to the seventh embodiment.

FIG. 7 is a side sectional view showing a light emitting device package according to the seventh embodiment.

In the seventh embodiment, the same reference numerals will be assigned to the same elements and description about the elements and structures that have already been explained in the first embodiment will be omitted in order to avoid redundancy.

Referring to FIG. 7, the light emitting device package 100C includes a body 110B having an upper body 101 and a lower body 102.

The upper body 101 and the lower body 102 of the body 110B may include the transmittive material. According to another embodiment, the lower body 102 of the body 110B may include a material having light transmittance lower than that of the upper body 101. For instance, the lower body 102 may include a polymer material. The lower body 102 is disposed under the lead electrodes 121 and 123 and the upper body 101 is disposed over the lead electrodes 121 and 123 and formed with the cavity 115.

The first and second lead electrodes 121 and 123 are disposed on the bottom surface of the cavity 115 while passing through the body 110B.

An isolation member 112A is formed in the body 110B. The isolation member 112A is disposed between the first and second lead electrodes 121 and 123 and extends downward through the lower body 102. A lower surface of the isolation member 112A is disposed in line with a lower surface of the body 110A. The isolation member 112A can be formed after the lower body 102 of the body 110B has been formed or simultaneously with the body 110B. The isolation member 112A has reflectance higher than that of the upper body 101. Similar to the lower body 102, the isolation member 112A may include the polymer material.

The first and second lead electrodes 121 and 123 support the upper and lower bodies 101 and 102 and reflect the incident light.

According to the light emitting device package 100C, the light transferring through the transmittive upper body 101, the molding member 130 and the lens member 140 can be omni-directionally emitted, so that the color coordination deviation can be improved in the light distribution region.

Figure 8:
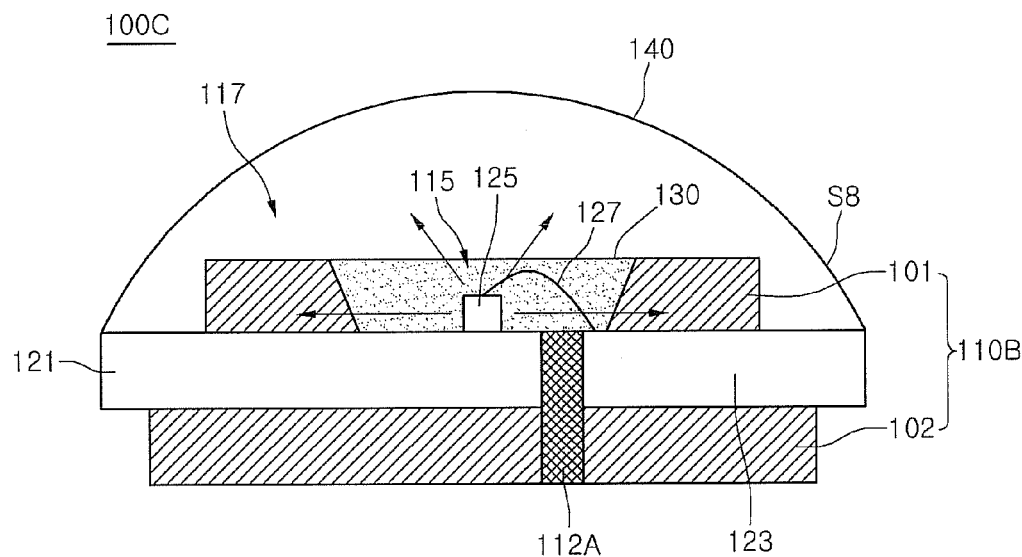
FIG. 8 is a side sectional view showing a light emitting device package according to the eighth embodiment.

FIG. 8 is a side sectional view showing a light emitting device package according to the eighth embodiment.

Referring to FIG. 8, the light emitting device package 100C includes body 110B having upper and lower bodies 101 and 102, and a lens member 140 surrounding the upper body 101.

An outer portion S8 of the lens member 140 is spaced outward from the upper body 101. A lower surface of the outer portion S8 of the lens member 140 makes contact with the top surfaces of the first and second lead electrodes 121 and 123, so that moisture can be prevented from penetrating into the body 110B and the beam angle of the light can be improved.

A width of the upper body 101 of the body 110B may be different from a width of the lower body 102 of the body 110B. For instance, the width of the upper body 101 of the body 110B is longer than the width of the lower body 102 of the body 110B to support the lead electrodes 121 and 123.

Out end portions of the lead electrodes 121 and 123 may extend to the lower surface of the body 110B, but the embodiment is not limited thereto.

Figure 9:
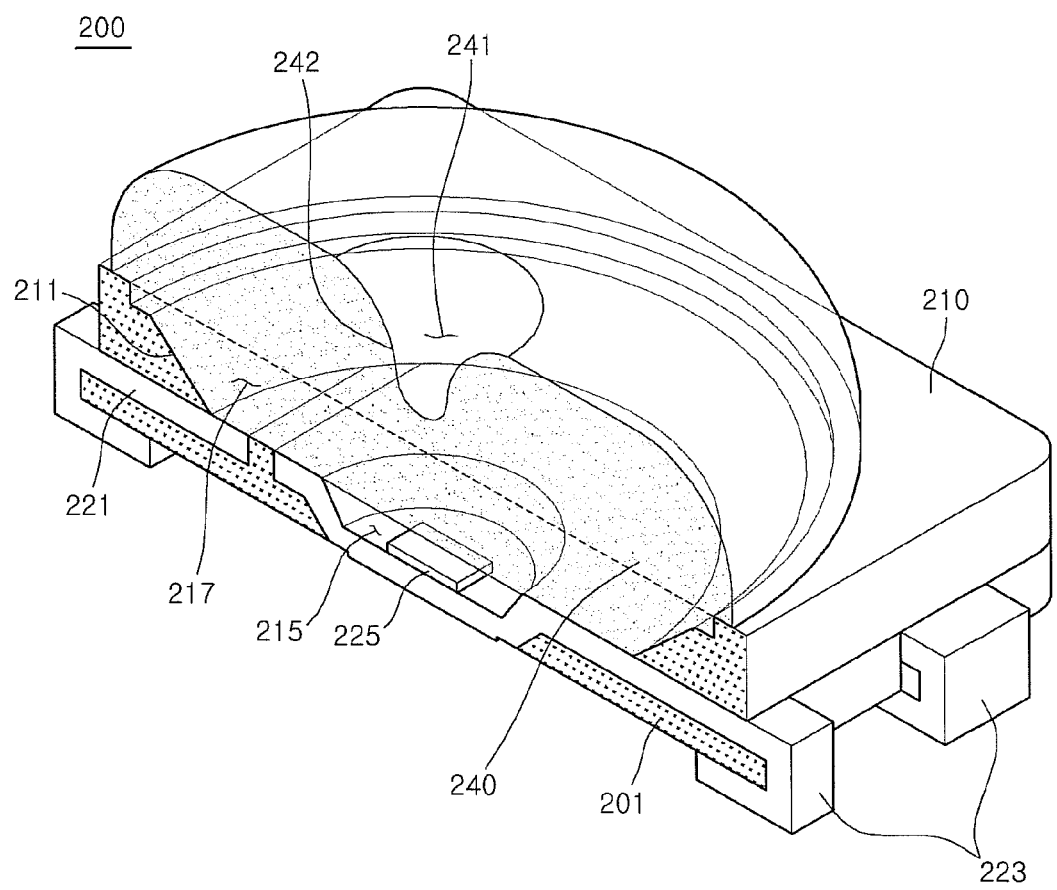
FIG. 9 is a side sectional view showing a light emitting device package according to the ninth embodiment.

FIG. 9 is a side sectional view showing a light emitting device package according to the ninth embodiment.

In the ninth embodiment, the same reference numerals will be assigned to the same elements and description about the elements and structures that have already been explained in the first embodiment will be omitted in order to avoid redundancy.

Referring to FIG. 9, the light emitting device package 200 includes a body 210, a lower body 201, a first lead electrode 221, a second lead electrode 223, a light emitting device 225, a molding member 230, and a lens member 240.

A first section of the first lead electrode 221 is disposed on a part of a lower surface of the receiving part 117, and a second section of the first lead electrode 221 extends outward through the body 210 and is located on a lower surface of the lower body 201. The first section of the first lead electrode 221 may be opposite to the second section of the first lead electrode 221.

A first section of the second lead electrode 223 is separated from the first lead electrode 221 at the lower surface of the receiving part 117 to form the cavity 215 in the body 210. A second section of the second lead electrode 223 extends outward through the body 210 and is located on the lower surface of the lower body 201. The first section of the second lead electrode 223 may be opposite to the second section of the second lead electrode 223.

The light emitting device 225 is disposed on the second lead electrode 223 and connected to the first and second lead electrodes 221 and 223 through a wire bonding scheme and/or a die bonding scheme.

The body 210 is provided on the first and second lead electrodes 221 and 223 and the receiving part 217 is formed in the body 210. The cavity 215 is formed at the center of the receiving part 217.

The body 210 is made from a transmittive material including at least one of selected from the group consisting of silicon or epoxy, and a glass material.

The lower body 201 is formed under the body 210 and the first and second lead electrodes 221 and 223. The lower body 201 may include a transmittive material. According to another embodiment, the lower body 201 may include a material different from a material of the body 210, such as polymer.

The light emitting device 225 is provided in the cavity 215 defined by the second electrode 223 and the molding member 230 is provided in the cavity 215. The lens member 240 is provided on the molding member 230. The lens member 240 may include a lateral reflection type les formed at the center thereof with a recess 242.

The light emitted from the light emitting device 225 may transfer in the upward and lateral directions. The light transferring in the upward direction is directed to the upward direction by the second lead electrode 223 and a part of the light transferring in the upward direction is reflected in the peripheral direction by the recess 242 and the remaining light is transmitted to the outside.

The second lead electrode 223 is formed with the cavity 215 to reflect the light emitted from the light emitting device 225 in the lateral direction. The light reflected from the recess 242 of the lens member 240 can be transmitted through the body 210.

According to the light emitting device package 200, a part of the light transferring in the lateral direction can be reflected by the second lead electrode 223 and a part of the light transferring in the upward direction can be reflected in the lateral direction by the lens member 240, so that the light may be distributed with the wide beam angle. Thus, the color variation between the center and the side of the lens member can be improved.

Figure 10:
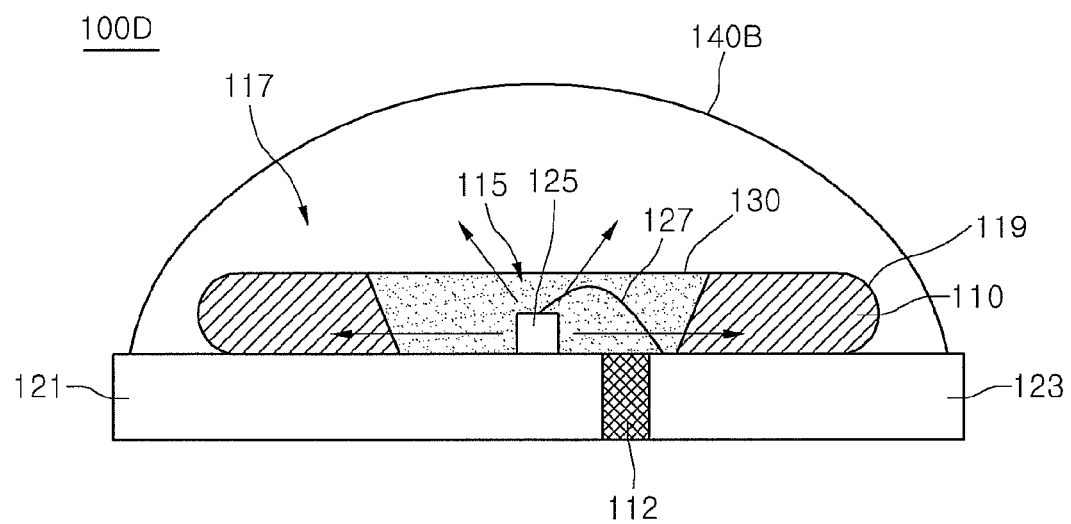
FIG. 10 is a side sectional view showing a light emitting device package according to the tenth embodiment.

FIG. 10 is a side sectional view showing a light emitting device package according to the tenth embodiment.

Referring to FIG. 10, the light emitting device package 100D includes a cavity 115, a first lead electrode 121, a second lead electrode 123, a body 110, an isolation member 112, a light emitting device 125, a molding member 130, and a lens member 140.

At least one side of the body 110 may be curved to refract the light passing through the transmittive body 110.

The top surface and the lateral side of the body 110 may have the hemispherical shape to improve the light extraction efficiency.

The body 110 is made from a transmittive material including a resin material, such as silicon or epoxy, or a glass material.

Lighting System

Although the top-view type light emitting device package is illustrated and disclosed in the embodiment, the side-view type light emitting device package can be used to improve the light distribution characteristics. In addition, the interval between the light emitting device packages 100 can be reduced when the light emitting device packages 100 are mounted on the board.

Figure 11:
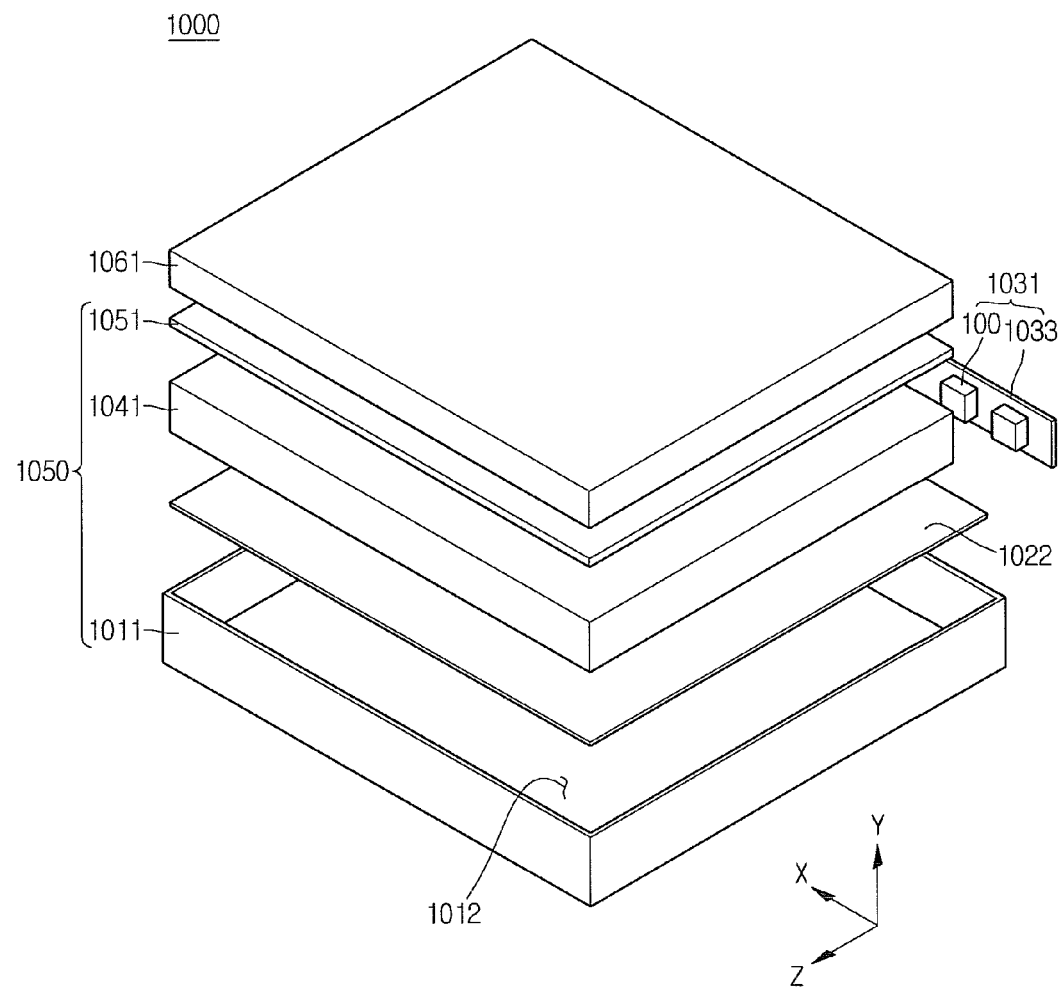
FIG. 11 is an exploded perspective view showing a display device according to the embodiment.
Figure 12:
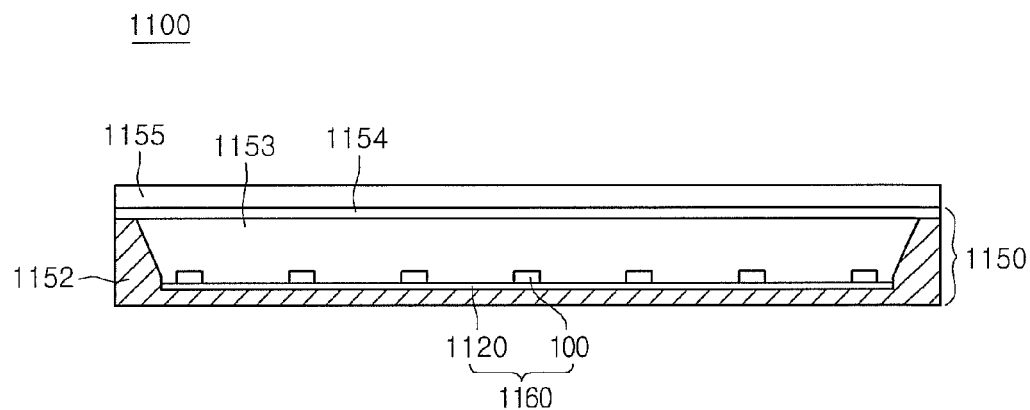
FIG. 12 is a sectional view showing a display device according to another embodiment.
Figure 13:
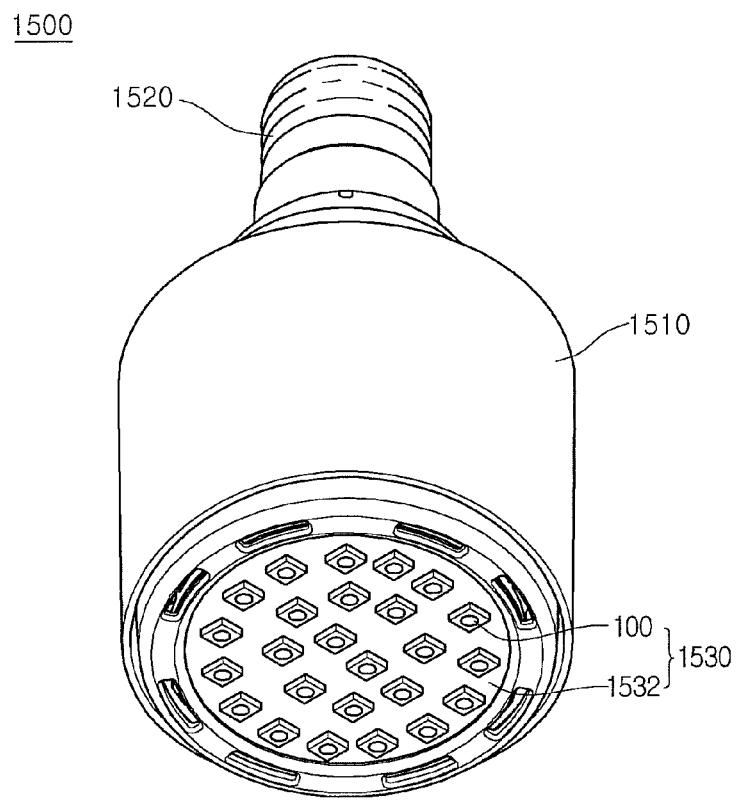
FIG. 13 is a perspective view showing a lighting device according to the embodiment.

The light emitting device package according to the embodiment can be applied to a light unit. The light unit includes a plurality of light emitting devices or a plurality of light emitting device packages. The light unit may include a display device as shown in FIGS. 11 and 12 and a lighting device as shown in FIG. 13. In addition, the light unit may include a lighting lamp, a signal lamp, a headlight of a vehicle, and an electric signboard.

FIG. 11 is an exploded perspective view showing the display device according to the embodiment.

Referring to FIG. 11, the display device 1000 according to the embodiment includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 supplies the light to at least one side of the light guide plate 1041 and serves as the light source of the display device.

At least one light emitting module 1031 is provided to directly or indirectly supply the light from the lateral side of the light guide plate 1041. The light emitting module 1031 may include a substrate 1033 and light emitting device packages 100 according to the embodiments. The light emitting device packages 100 are arranged on the substrate 1033 while being spaced apart from each other at the predetermined interval.

The substrate 1033 may include a printed circuit board (PCB) having a circuit pattern (not shown). In addition, the substrate 1033 may also include a metal core PCB (MCPCB) or a flexible PCB (FPCB), but the embodiment is not limited thereto. If the light emitting device packages 100 are disposed on the side of the bottom cover 1011 or on a heat dissipation plate, the substrate 1033 may be omitted. The heat dissipation plate partially makes contact with the top surface of the bottom cover 1011.

In addition, the light emitting device packages 100 are arranged such that light exit surfaces of the light emitting device packages 100 are spaced apart from the light guide plate 1041 by a predetermined distance, but the embodiment is not limited thereto. The light emitting device packages 100 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is transferred downward through the lower surface of the light guide plate 1041, toward the light guide plate 1041, thereby improving the brightness of the light unit 1050. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an open top surface, but the embodiment is not limited thereto. The bottom cover 1011 can be coupled with the top cover, but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including transparent first and second substrates, which are opposite to each other, and a liquid crystal layer interposed between the first and second substrates. A polarizing plate can be attached to at least one surface of the display panel 1061, but the embodiment is not limited thereto. The display panel 1061 displays information based on the light that has passed through the optical sheet 1051. The display device 1000 can be applied to various portable terminals, monitors of notebook computers, monitors of laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhancement sheet. The diffusion sheet diffuses the incident light, the horizontal and vertical prism sheet concentrates the incident light onto the display region, and the brightness enhancement sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 12 is a sectional view showing a display device according to the embodiment.

Referring to FIG. 12, the display device 1100 includes a bottom cover 1152, a substrate 1120 on which the light emitting device packages 100 are arrayed, an optical member 1154, and a display panel 1155.

The substrate 1120 and the light emitting device packages 100 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one selected from the group consisting of a lens, a light guide plate, a diffusion sheet, a horizontal and vertical prism sheet, and a brightness enhancement sheet. The light guide plate may include PC or PMMA (Poly methyl methacrylate). The light guide plate can be omitted. The diffusion sheet diffuses the incident light, the horizontal and vertical prism sheet concentrates the incident light onto the display region, and the brightness enhancement sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 13 is a perspective view showing a lighting device according to the embodiment.

Referring to FIG. 31, the lighting device 1500 includes a case 1510, a light emitting module 1530 disposed in the case 1510, and a connection terminal 1520 disposed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 100 disposed on the substrate 1532. The light emitting device packages 100 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 100 is disposed on the substrate 1532. Each light emitting device package 100 may include at least one LED (light emitting diode) chip. The LED chip may include an LED that emits the light of visible ray band having red, green, blue or white color and a UV (ultraviolet) LED that emits UV light.

The light emitting device packages 100 of the light emitting module 1530 can be variously combined to provide various colors and brightness. For instance, the white LED, the red LED and the green LED can be combined to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

The embodiment can provide the light emitting device package having the novel structure. The embodiment can provide the light emitting device package having the wide light distribution. The embodiment can provide the light emitting device package capable of improving the color variation.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a plurality of lead electrodes;
   a body on a top surfaces of the plurality of lead electrodes;
   a cavity in the body;
   an isolation member disposed between the plurality of lead electrodes;
   a light emitting device disposed in the cavity and electrically connected to the plurality of lead electrodes;
   a molding member in the cavity; and
   a lens member over the body,
   wherein the body includes a light-transmittive material,
   wherein the isolation member includes a material different from the light-transmittive material of the body,
   wherein the isolation member includes the material having reflectance higher than that of the body,
   wherein the lens member includes plurality of support parts located at an outer position and lateral sides of the body.

2. The light emitting device package as claimed in claim 1, wherein a maximum width of the lens member is wider than a width of a top surface of the body.

3. The light emitting device package as claimed in claim 2, wherein the lens member includes a receiving part contacted with a top surface of the body.

4. The light emitting device package as claimed in claim 3, wherein the receiving part of lens member is contacted with the molding member.

5. The light emitting device package as claimed in claim 2, wherein the body includes plurality of protrusions protruded in a direction toward the lens member.

6. The light emitting device package as claimed in claim 5, wherein the plurality of protrusions are contacted with the lens member.

7. The light emitting device package as claimed in claim 1, wherein the lens member includes a recess overlapped with the light emitting device in a perpendicular direction.

8. The light emitting device package as claimed in claim 7, wherein the recess of the lens member is disposed in opposite side to a receiving part and recessed toward the receiving part.

9. The light emitting device package as claimed in claim 1, wherein the isolation member has a thickness equal to or thicker than a thickness of each of the lead electrodes.

10. The light emitting device package as claimed in claim 1, wherein the body includes at least one selected from the group consisting of silicon, epoxy and glass material.

11. The light emitting device package as claimed in claim 10, wherein the isolation member includes at least one selected from the group consisting of PPA (polyphthal amide), LCP (liquid crystal polymer), PPS (polyphenylene sulfide) and PEEK (polyether ether ketone).

12. The light emitting device package as claimed in claim 2, wherein each of the plurality of lead electrodes extends outward beyond at least one of the lateral sides of the body.

13. The light emitting device package as claimed in claim 2, wherein the plurality of support parts are protruded in a direction toward the plurality of lead electrodes.

14. A light emitting device package comprising:
   a plurality of lead electrodes;
   a body on a top surfaces of the plurality of lead electrodes;
   a cavity in the body;
   an isolation member contacted between the plurality of lead electrodes;
   a light emitting device on at least one of the plurality of lead electrodes in the cavity;
   a molding member in the cavity; and
   a lens member over the body,
   wherein the body includes a light-transmittive material,
   wherein the isolation member includes a material different from the light-transmittive material of the body,
   wherein the lens member includes plurality of support parts located at an outer position and lateral sides of the body,
   wherein the plurality of lead electrodes are located under a bottom surface of the body.

15. The light emitting device package as claimed in claim 14, wherein the body includes at least one selected from the group consisting of silicon, epoxy and glass, and the isolation member includes a material having a reflectance higher than a reflectance of the body.

16. The light emitting device package as claimed in claim 14, wherein a peripheral side of the cavity is inclined with respect to the top surfaces of the plurality of lead electrodes.

17. The light emitting device package as claimed in claim 14, wherein the lens member includes a receiving part contacted with at least one of the body and the lead electrodes.

18. The light emitting device package as claimed in claim 14, wherein the receiving part of lens member is disposed on a top surface of the molding member and a top surface of the body.

19. The light emitting device package as claimed in claim 14, wherein a maximum width of the lens member is wider than a width of a top surface of the body.

20. The light emitting device package as claimed in claim 15, wherein the lens member includes a recess disposed in opposite side to a receiving part of the lens member and recessed toward the receiving part.

* * * * *